United States Patent [19]

Shibahara et al.

[11] Patent Number: 5,662,877
[45] Date of Patent: Sep. 2, 1997

[54] PROCESS FOR FORMING DIAMOND-LIKE THIN FILM

[75] Inventors: Masanori Shibahara; Kunihiro Ueda; Masatoshi Nakayama, all of Saku, Japan

[73] Assignee: TDK Corporation, Tokyo, Japan

[21] Appl. No.: 827,853

[22] Filed: Jan. 30, 1992

Related U.S. Application Data

[63] Continuation of Ser. No. 547,732, Jul. 2, 1990, abandoned.

[30] Foreign Application Priority Data

Aug. 23, 1989 [JP] Japan .................... 1-214913

[51] Int. Cl.$^6$ .................................... C30B 29/04
[52] U.S. Cl. .................... 423/446; 117/103; 117/929; 204/173
[58] Field of Search .............. 423/446; 156/DIG. 68, 156/610; 204/173, 157.47; 117/929, 103

[56] References Cited

U.S. PATENT DOCUMENTS

| | | | |
|---|---|---|---|
| 3,305,331 | 2/1967 | Inoue | 423/446 |
| 3,630,678 | 12/1971 | Gardner | 423/446 |
| 3,961,103 | 6/1976 | Aisenberg | 423/446 |
| 4,490,229 | 12/1984 | Mirtich et al. | 423/446 |
| 4,504,519 | 3/1985 | Zelez | 423/446 |
| 4,725,345 | 2/1988 | Sakamoto et al. | 204/192.11 |
| 4,767,608 | 8/1988 | Matsumoto et al. | 204/173 |
| 4,822,466 | 4/1989 | Rabulais et al. | 204/192.15 |
| 4,830,702 | 5/1989 | Singh et al. | 423/446 |
| 4,988,421 | 1/1991 | Draul et al. | 204/192.16 |

FOREIGN PATENT DOCUMENTS

| | | | |
|---|---|---|---|
| 230927 | 8/1987 | European Pat. Off. | 423/446 |
| 174507 | of 1984 | Japan | 156/610 |
| 59-174508 | 3/1984 | Japan . | |
| 200898 | 10/1985 | Japan | 156/610 |
| 204695 | 10/1985 | Japan | 156/610 |
| 61-151096 | 7/1986 | Japan | 423/446 |
| 174376 | 10/1986 | Japan | 156/610 |
| 234396 | 9/1989 | Japan | 423/446 |
| 234397 | 9/1989 | Japan | 423/446 |
| 184595 | 7/1990 | Japan | 423/446 |
| 196095 | 8/1990 | Japan | 423/446 |

OTHER PUBLICATIONS

Yoshikatsu Namba, "Diamondline Carbon Films Prepared by Charged Particles," *Surface Chemistry*, 5, pp. 108–115 (1984).

*Primary Examiner*—Robert Kunemund
*Attorney, Agent, or Firm*—Panitch Schwarze Jacobs & Nadel, P.C.

[57] ABSTRACT

The present invention improves the adhesive property by pretreating under uniform conditions the substrate surface of metal, ceramics or glass etc. with a poor adhesive property, by accelerating ions under an electric field to the substrate in advance of a diamond-like film forming process. In light of the fact that a diamond-like film forming process by ionized deposition uses thermal electron ionization means and an electric potential is applied to a grid to accelerate ionized hydrocarbon ions, the present invention could attain the aimed purpose by ionizing and then accelerating a bombardment gas such as argon as a pretreatment process in the same apparatus.

5 Claims, 3 Drawing Sheets

Fig. I

PROCESS FOR FORMING DIAMOND-LIKE THIN FILM

This application is a continuation of Ser. No. 07/547,732 filed on Jul. 2, 1990, now abandoned.

DETAILED EXPLANATION OF THE INVENTION

1. Field of the Industry

The present invention relates to a process for forming a diamond or diamond-like thin film, and more particularly it relates to a film forming technique which improves the adhesive property or the bonding strength of a diamond or diamond-like thin film to a substrate.

2. Prior Arts and Their Problems

A diamond or diamond-like thin film (hereinafter called diamond-like thin film) produced by a gaseous phase method is superior in hardness, wear-resistance, durability, anti-chemical property, anti-corrosion property and as it can be adhered on a substrate of any shape, it is useful or believed to be hopeful as a protection film for an object which requires one or more of these properties.

There are many types of processes for forming a diamond-like thin film according to the gaseous phase method. (Refer, e.g., to "Various processes" at pages 108–115 of "HYOMEN KAGAKU" (Surface Chemistry), 5, 108 (1984)). A diamond-like thin film can cover an object with any shape to be protected and is widely used as a protection film for anti-corrosion or wear-resistance, etc.

However, diamond-like thin films produced by these prior methods have a poor bonding strength to a substrate depending on the kind of substrate and is easily peeled off from a substrate by an external force because these diamond-like thin films consist of an ensemble of micro crystals which is a cause of a large surface roughness. Therefore, their superior properties are not fully utilized in applications as protection films which require anti-corrosion property, wear-resistance property and the like. It is particularly known that iron or its alloys (e.g. mild steel (STC), stainless steel, hardened steel (SKD, SKS, etc.)), other metals or alloys such as Co, Ni and the like or their alloys, glass, ceramics, etc. have a poor bonding strength to a diamond-like thin film. Examples of substrates made of iron as a chief element are mold, grinding material, etc. which have a highest industrial value, while substrates made of glass or ceramics are used for a moving part of a thermal head etc. As it is used for many purposes, it is very important to improve the adhesive property of a diamond-like thin film to a substrate on which it is formed.

A preliminary treatment to the substrate is proposed in Japanese Patent Application Public Disclosure Nos. 200898/1985, 204695/1985 and 174376/1986. In Patent Application Public Disclosure No. 200898/1985, a diamond-like thin film is bonded to a substrate of a Co-WC alloy as a high hardness film and to this end it is proposed to pretreat the substrate by ion etching, using a glow discharge of direct current or alternating current directly to the surface of the substrate. The purpose is to increase the film-forming speed by increasing growing nuclei of diamond crystals, but, from the viewpoint of improvement of the adhesive property, the etching efficiency is not sufficiently high as an accelerating voltage is not applied, and the purpose of the present invention aiming at improvement of the adhesive property is, therefore, not attained sufficiently. Patent Application Public Disclosure No. 204695/1985 aiming at improvement of the film-forming speed proposes to introduce Ar gas into a vacuum chamber and forms a plasma by applying a voltage between an anode and a cathode to treat the substrate. However, in respect of improvement of adhesive property, the etching effect is small due to a low ion density of the plasma and, moreover, there is a problem in this process as will be described in the following in that the ions can be used only when the substrate is a metal and when a voltage can be applied to the substrate, while the present invention can be applicable to an insulating material such as glass and ceramics. In Patent Application Public Disclosure No. 174376/1986 it is described that, after the substrate is treated by a plasma gas to improve adhesive property of the substrate, an oxidized film may be formed by an oxidizing treatment. However, this process uses a high-frequency electric field to produce a plasma and adopts a method in which only the positive ions among the ions passed through a grid of a positive potential are accelerated toward a metal substrate connected to a negative potential. Therefore, it is required for the plasma to pass through the grid of a positive potential by diffusion in the first place, which means that a sufficient quantity of positive ions required for film-forming can not reach to the substrate and that this method results in a low efficiency.

Accordingly, a film-forming with a sufficiently high bonding strength between a substrate and a diamond-like film was not available by the prior technologies.

PURPOSE OF THE INVENTION

The purpose of the present invention is to present a diamond-like thin film with a high bonding strength or adhesion to a substrate, an anti-peeling off property and a high durability. Still another purpose of the present invention is to present a process for forming a diamond-like thin film which contains a pretreatment step with a high treatment efficiency.

BRIEF SUMMARY OF THE INVENTION

The present invention attains the above mentioned purposes in a process for forming a diamond-like thin film on the surface of a substrate selected from a group of metals and alloys containing at least one of Co, Ni and Fe, ceramics and glass which have a poor affinity to said diamond-like thin film, by adopting a preliminary process, which comprises, prior to ionized deposition, disposing said substrate in a vacuum chamber of a film-forming apparatus, introducing into said vacuum chamber a bombardment gas, forming a stream of ions by ionizing means which consists of a thermal filament cathode and an anode surrounding the cathode, and accelerating the resulting stream by a grid which is at a lower potential than said anode to bombard the surface of the substrate.

The prime merits of the preliminary process according to the present invention are that a bonding strength between the film and the substrate can be improved and moreover that a pretreatment process and then a diamond film-forming process can be carried out successively using the same apparatus with little changes of conditions. The reason why the effects of the present invention can be obtained is not clear, but it may be understood that oxided substances, unnecessary radicals and other smudges necessarily formed on the substrate surface in the air are removed, which improves the activity of the substrate surface. In fact, as a result of the observation at $5 \times 10^4$–$15 \times 10^4$ magnifications by a SEM (scanning electron microscope) of the interface between the diamond-like thin film and the substrate, it was found that the interface had changed within the range of about 100 Å.

According to the present invention the adhesion of a diamond-like thin film is uniform and the defects are reduced.

DETAILED EXPLANATION OF THE INVENTION

As briefly described above, the present invention improves the adhesive property by pretreating under uniform conditions the substrate surface of metal, ceramics or glass etc. with a poor adhesive property, by accelerating ions under an electric field to the substrate in advance of a diamond-like film forming process. In light of the fact that a diamond-like film forming process by ionized deposition uses thermal electron ionization means and an electric potential is applied to a grid to accelerate ionized hydrocarbon ions, the present invention could attain the aimed purpose by ionizing and then accelerating a bombardment gas such as argon as a pretreatment process in the same apparatus.

The ionized deposition process uses a hydrocarbon feed gas or a feed gas capable of producing a hydrocarbon upon decomposition or reaction. (Here the term hydrocarbon is used to mean any of saturated hydrocarbons, such as methane, ethane, and propane, and unsaturated hydrocarbons, such as ethylene, propylene, and acetylene. The feed gas capable of producing a hydrocarbon on decomposition is an alcohol, such as methyl alcohol or ethyl alcohol, or a ketone, such as acetone or methyl ethyl ketone, or the like. The feed gas capable of producing a hydrocarbon gas on reaction is a mixed gas such as of carbon monoxide, carbon dioxide, and hydrogen or the like. The feed gas may contain at least one member of the family consisting of such rare gases as helium, neon, and argon, or hydrogen, oxygen, nitrogen, water, carbon monoxide, carbon dioxide, and the like.) According to the process, the feed gas is ionized by arc discharge between a thermal filament cathode and an anode or by thermionic emission between a thermal filament cathode and an anode, and the resulting ion beam is accelerated by an electric field and directed to the substrate, whereby a diamond-like thin film is formed on the substrate. As described in Japanese Patent Application Public Disclosure No. 174507/1984, Japanese Patent Application Nos. 59376/1988, 59377/1988, 1199/1989 and 15093/1989, ionized deposition does not require such a high substrate temperature above 700° C. as are used in other processes. (Refer, e.g., to "HYOMEN KAGAKU" (Surface Chemistry), 5, 108 (1984), pp. 108–115, "Various processes".) The process is also superior in that it achieves a high film-forming efficiency and that the resulting diamond-like film has good surface quality, high hardness, high heat transfer rate, high refractive index, etc., while eliminating the necessity of surface finish. Therefore, the present invention uses this process.

EXPLANATION OF WORKING EXAMPLES

Film-Forming Apparatus

Figure 1:
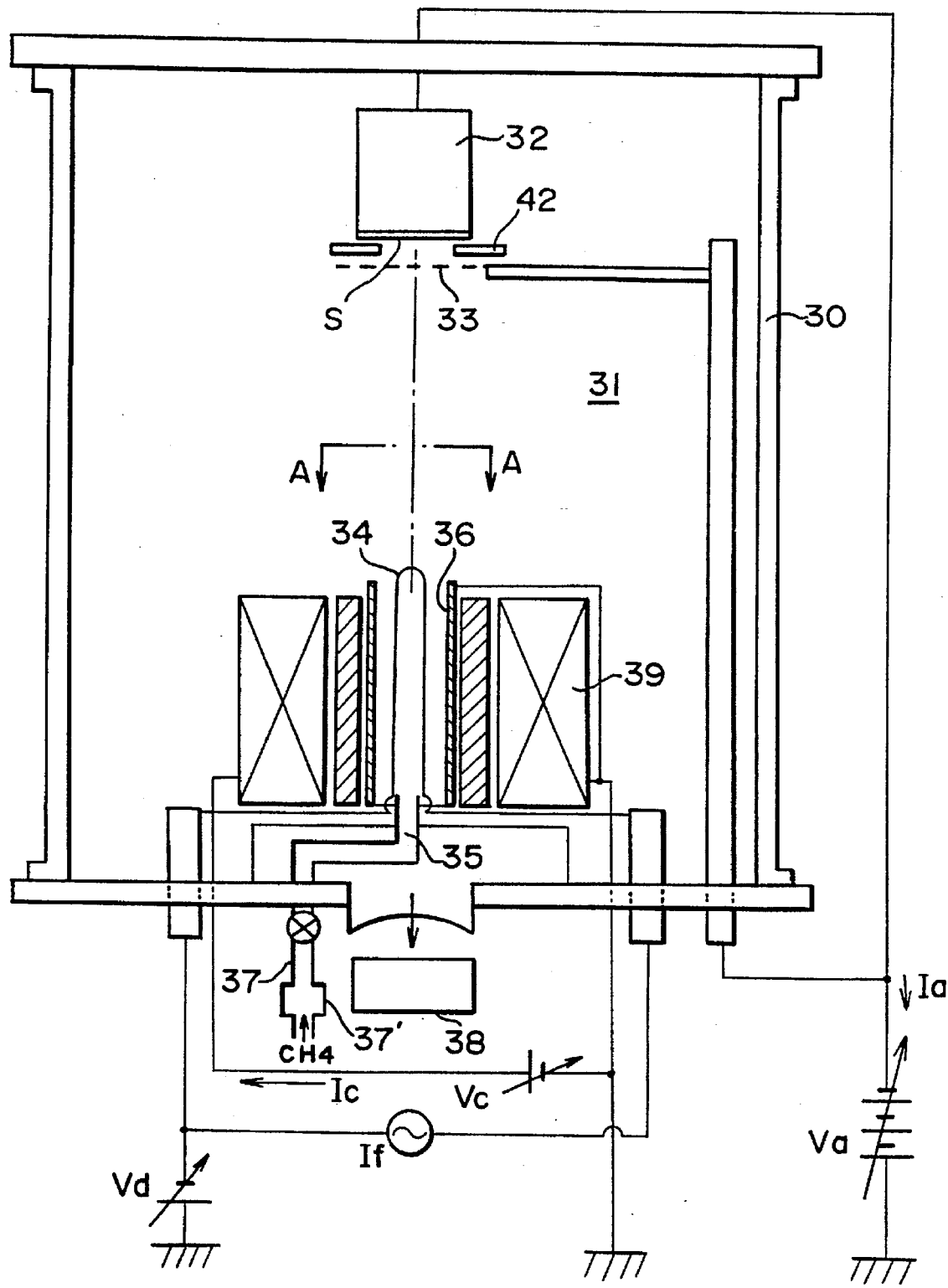
FIG. 1 is a cross-sectional view illustrating an example of a diamond-like thin film producing apparatus of the present invention.

FIG. 1 illustrates a preferred example of film-forming apparatus. In the figure, the numeral 30 designates a vacuum vessel and 31 a chamber connected to an evacuation system 38 so that it can be evacuated to a high vacuum of about $10^{-6}$ Torr. The numeral 32 indicates an electrode located at the back of a substrate S and kept at a negative potential Va. On the surface of the substrate S disposed close or touched is a mask 42 which has a window to regulate a shape or form of a diamond-like thin film. This mask may be contacted with the substrate, but to decrease cracks by thinning the thickness of the film periphery it is preferred to be separated. The numeral 33 indicates a grid to which the same potential Va is applied as to the substrate and is used to accelerate hydrocarbon ions in the process of film-forming. For this grid 33 may be used a grid with a properly determined space ratio (an area of holes per unit area) and a hole density (a quantity of holes per unit length) to enhance a continuity of the film and to smooth the surface, or with means to vibrate in the planer direction. The numeral 34 indicates a thermal filament cathode which is kept at a negative potential Vd and is heated by an alternative current source If to generate thermal ions. The numeral 35 indicates an inlet for feeding a hydrocarbon gas as a starting material and a preliminary treatment gas (bombardment gas). An anode 36 is arranged around the filaments 34. This anode is earthed in this example but has a positive voltage Vd against the filaments and a positive potential is given against the electrode 32 and grid 33. An electromagnetic coil 39 which is excited by an electric current Ic from an electric source Vc is so disposed as to surround the filaments 34, anode 36 and feed inlet 35 to produce a magnetic field for the containment of ionized gas. It is thus possible to modify the quality of the resulting film through the adjustments of If, Vd, Va, the current Ic of coil and an ion current Ia.

Figure 3:
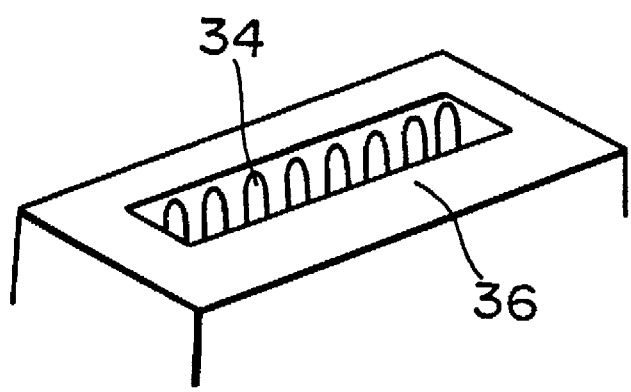
FIG. 3 is a perspective view illustrating a structure of filament part.

FIG. 3 illustrates a perspective view from A—A line. In case where a form of film is rectangular it can be used e.g. an arrangement of plural filaments as shown or ones wound like a coil. To form a film over a broad area possible methods are such that a long length of a substrate is moved at a low speed or the ion beam scans over the surface of the substrate.

In FIG. 1, a plasma exciting chamber 37' is located on a feed line 37 for the hydrocarbon gas to enhance the efficiency of the ionization apparatus. For the plasma excitation, it is possible to utilize, e.g., micro wave, high frequency (RF waves), radiant rays, ultraviolet rays, etc.

Figure 2:
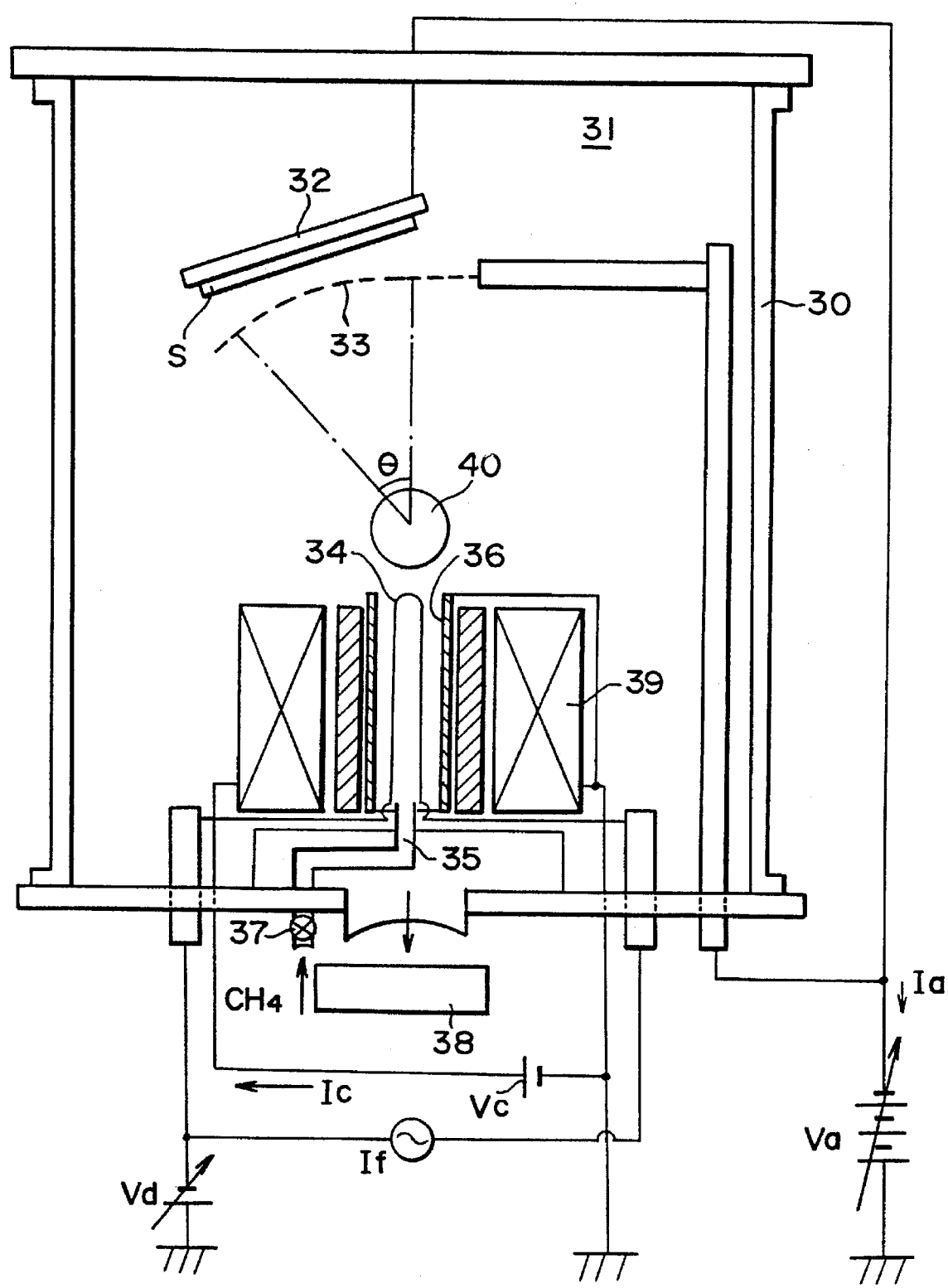
FIG. 2 is a cross-sectional view illustrating another example of a diamond-like thin film producing apparatus.

It is further possible, as illustrated in FIG. 2, to modify the construction of FIG. 1 partly so as to hold a magnet 40 of fixed or variable strength above the filaments 34 and use it for the deflection of the plasma-like ion beam. The magnetic field of the magnet 40, with fixed or variable strength, is directed across the direction of the ion beam. In this way a deflection angle $\theta$ is obtained with respect to the desired ion, e.g., $CH_3^+$ or $CH_4^+$. With a magnet of fixed field strength, ions vastly different in mass from these ions, such as hydrogen ions, are deflected to an even greater degree, whereas neutral particles and heavy polymeric ions move straight ahead. Provision of a mask in the straight direction, therefore, permits only the ions of high crystallinity to deposit on the substrate S.

Pretreatment Process

The pretreatment process of the present invention can be carried out by utilizing an bombardment gas such as argon instead of hydrocarbon gas, using an above-described film-forming apparatus as it is and selecting the conditions properly. For bombarding or pretreating the substrate with a poor adhesive property such as Fe or the alloys, glass, ceramics, etc., the vacuum chamber is evacuated up around to $10^{-6}$ Torr, then, a bombardment gas selected from argon, nitrogen, hydrogen, helium, neon, or the like is introduced up around to 0.1 Torr from the feed inlet 35 and ionized by the filaments 34, and the resulting argon ions are accelerated by the grid 33. The argon ions bombard and clean the surface of the substrate S, which improves the adhesive property. The necessary controlling factors are a voltage or current applied to each part, a molecular weight of the bombardment gas (an average molecular weight in case of a mixed gas) and treatment time.

The etching energy can be indicated in a formula of molecular weight×Ia (mA)×time (Hr) in which molecular weight is that of bombardment gas, Ia an ion current and time a bombardment treatment time, and it should preferably satisfy 50<molecular Weight×Ia (mA)×time (Hr)<500. If the value is below 50, the bombardment of substrate surface can not sufficiently be done and it causes peeling off of the film due to insufficient bonding between the diamond-like thin film and the substrate. If the value is above 500, the bombardment energy is so big that even the grid and other components can be etched, the film quality is worsened by intermixing impurities into the film and further the peeling off occurs. It is also confirmed by an observation using SEM that the substrate surface becomes rougher and poor for the film to adhere. Overetching thus has an adverse effect.

Film-Forming Process

In the next process of the film-forming process, the chamber 31 is evacuated up to a high vacuum of $10^{-6}$ Torr, while methane gas or a mixed gas of methane and hydrogen, with or without a carrier gas such as Ar, He, or Ne, is introduced into the chamber from each feed inlet 35 at a predetermined flow rate through manipulation of a valve in the gas feed line 37, the evacuation system 38 is controlled to establish a desired gas pressure, e.g. $10^{-1}$ Torr. Meanwhile, the single or multiple thermal filament cathode 34 is heated by passage of an alternating current If, and a voltage Vd is applied between the cathode 34 and the anode 36 to cause a discharge. Methane gas fed through the feed inlet 35 is thermally decomposed while colliding with thermal ions from the filaments to form positive ions and electrons. The latter collides with other thermally decomposed particles. Repetition of this phenomenon under the containment action of the field of the magnetic coil converts the methane gas into positive ions of the thermally decomposed material.

The positive ions are attracted by a negative potential applied to the electrode 32 and the grid 36 and are accelerated toward the substrate S, until they collide with the substrate to undergo a film-forming reaction and thereby form a diamond-like thin film thereon. If desired, the aforedescribed fixed magnet may be utilized to obtain a thin film of an even better quality.

For the potential, current, temperature, and other conditions for the individual parts involved, refer to the above-mentioned patent applications, publications, and other known pieces of the literature.

The thickness of the film to be formed is desired to range from 100 to 10000 Å. If it is below the specified range the wear resistance decreases, and if it is above the range there is no more beneficial effect while the production time is extended.

The present invention will be illustrated hereafter.

WORKING EXAMPLES 1, 2 and 3

The apparatus shown in FIG. 1 was used, wherein the substrate S was located in the evacuation chamber 10 and at a distance about 6.0 mm from the grid 33. Each substrate was made of mild steel (STC) (Working Example 1), ceramics (Alumina) (Working Example 2) and glaze glass (containing $Al_2O_3$, BaO, etc.) (Working Example 3). The distance from the subsgrate S to the anti-cathode was about 40 mm. The hole density of the grid 33 was 60 25.4 mm and its space ratio 41%.

Preliminary treatment . . . After the evacuation chamber 10 was evacuated up to $10^{-6}$ Torr, Ar and $H_2$ gases were introduced. Under a gas pressure of 0.1 Torr the thermal filament cathode 34 was discharged. The magnetic flux density of electromagnetic coil 19 was 400 gauss, the substrate voltage and grid voltage were Va=−300 V and the substrate temperature 200° C. The current If was 20 A which was passed through the filaments 34. The filament voltage was Vd=−10 V and Vc=10 V. The filament of the cathode 34 was a coil with its width 3 mm and the gap between the coil and the surrounding anode 36 was 8 min.

Film-forming . . . Ar introduction was stopped when the evacuation chamber 10 had been evacuated up to $10^{-6}$ Torr and then methane gas was introduced into the chamber to have a gas pressure of $10^-$Torr and the thermal filament cathode 34 was discharged. The magnetic flux density of electromagnetic coil 19 was 400 gauss, the substrate voltage Va=−300 V and the substrate temperature 200° C. A current If =25 A was let flow through the coiled filament cathode 34.

The cathode 34 was of a coil type with its width 3 mm and the gap between itself and the anode 36 surrounding the cathode was 8 mm. The grid 33 was vibrated with a speed of 5 mm/mn.

Under the conditions of the cathode voltage Vd=−30 V and Vc=30 V, the diamond-like film with the film thickness 1.0 μm was obtained.

Thus, the resulting film was measured on the surface defect quantity and the adhesive property by a microscope observation. The results were shown in Tables 1–3. In the Table 1 is shown that of the substrate made of mild steel SKS the main ingredients of which were Fe, Cr and C, in Table 2 that of the substrate made of $Al_2O_3$ ceramics, and in Table 3 that of the substrate made of glaze glass the main ingredient of which were SiO,AlO and BaO. The surface defect was only measured when the film was made evenly, and a defect with a diameter over 1 μm by magnifying power of 400 magnifications was counted as one defect. The adhesive property was measured using a tension tester (Tenshiron, a trade name) by pulling the diamond-like thin film adhered by an epoxy resin on a square pillar with 1 cm×1 cm×10 cm until its peeling off.

For a comparison also shown is a cleaning successful and known for other metals and alloys. (advanteges)

As is clear from Tables 1–3, the diamond-like thin film formed on the substrate according to the present invention has a high bonding strength with a substrate because of the fact that the substrate is subjected to a preliminary bombardment treatment using ionized deposition method. Furthermore, according to the present invention the substrate is not necessarily required to be metals, but an insulating substrate such as glass and ceramics can also be film-formed without difficulties.

TABLE 1

(SKS Steel)

| | Pretreatment | Molecular Weight × Ia × Time | Adhesion | Defective number |
|---|---|---|---|---|
| Working | He | 100 | over 200 | 0 |
| Example | Ar | 100 | over 200 | 0 |
| Comparative | Ar | 10 | 5 | 5 |
| Example | Xe | 1000 | 10 | 15 |
| | Remark 1 | — | No | — |
| | Remark 2 | — | No | — |
| | Remark 3 | — | No | — |

Remark 1: Ultrasonic washing by pure water after washing by a neutral detergent.
Remark 2: Soaking for one hour in a sodium hydroxide with 3% density.
Remark 3: Ultrasonic washing by ethanol, acetone and pure water in order.

TABLE 2

(Ceramics)

| | Preliminary Treatment | Molecular Weight × Ia × Time | Adhesion | Defective number |
|---|---|---|---|---|
| Working | Ne | 100 | over 200 | 0 |
| Example | Ar | 100 | over 200 | 0 |
| Comparative | Ar | 10 | 3 | 3 |
| Example | Ne | 1000 | 20 | 20 |
| | Remark 1 | — | No | — |
| | Remark 2 | — | No | — |
| | Remark 3 | — | No | — |

Remarks 1, 2 and 3 are same as Table 1.

TABLE 3

(Glaze Glass)

| | Preliminary Treatment | Molecular Weight × Ia × Time | Adhesion | Defective number |
|---|---|---|---|---|
| Working Example | Xe | 110 | over 200 | 0 |
| | Ar | 80 | over 200 | 0 |
| Comparatiave | Ar | 10 | 2 | 19 |
| Example | Xe | 600 | 18 | 50 |
| | Remark 1 | — | 1 | 90 |
| | Remark 2 | — | No | — |
| | Remark 3 | — | No | — |

Remarks 1, 2 and 3 are same as Table 1.

We claim:

1. A process for forming a diamond-like thin film on a substrate selected from a group of alloys containing at least one of Co, Ni and Fe, ceramics and glass which have a poor affinity to said diamond-like thin film, which consists essentially of a) disposing said substrate in a vacuum chamber, introducing into said vacuum chamber a bombardment gas, forming a stream of ions by ionizing said bombardment gas with an ionizing means which consists essentially of a thermal filament cathode and an anode arranged around the cathode and accelerating the resulting stream of the ionized bombardment gas by a grid which is at a lower potential than said anode without neutralization to bombard the surface of the substrate which is positioned proximate to the grid and at substantially the same potential as the grid, and, after evacuation of the bombardment gas, b) introducing into the vacuum chamber a hydrocarbon of a low molecular weight or a material gas capable of producing a hydrocarbon of a low molecular weight upon decomposition or reaction under a pressure of about $10^{-1}$ torr, forming a stream of hydrocarbon ions by ionizing said hydrocarbon or material gas with an ionizing means which is comprised of a thermal filament cathode and an anode arranged around thereof, and accelerating the resulting stream of hydrocarbon ions by a grid which is at a lower potential than said anode to cause a film forming reaction on the substrate which is positioned proximate to the grid and at substantially the same potential as the grid.

2. A process for forming a diamond-like thin film of claim 1, wherein the molecular weight of the bombardment gas, the bombardment treatment time and the ion current satisfies a conditional formula of 50<molecular weight×Ia (mA)× time (Hr).

3. A process for forming a diamond-like thin film of claim 1, wherein said ionizing means and said grid in a) are common to those in b).

4. A process for forming a diamond-like thin film of claim 3, wherein the molecular weight of the bombardment gas, the bombardment treatment time and the ion current fulfill a conditional formula of 50<molecular weight×Ia (mA)×time (Hr).

5. A process for forming a diamond-like thin film of claim 1, characterized in that said bombardment gas is at least one selected from the group consisting of argon, nitrogen, hydrogen, helium and neon.

* * * * *